United States Patent [19]

Becker

[11] Patent Number: 5,537,739
[45] Date of Patent: Jul. 23, 1996

[54] METHOD FOR ELECTOCONDUCTIVELY CONNECTING CONTACTS

[75] Inventor: Rolf Becker, Reutlingen, Germany

[73] Assignee: Robert Bosch GmbH, Stuttgart, Germany

[21] Appl. No.: 386,036

[22] Filed: Feb. 9, 1995

[30] Foreign Application Priority Data

Mar. 28, 1994 [DE] Germany .................... 44 10 739.0

[51] Int. Cl.⁶ .................................................. H05K 3/34
[52] U.S. Cl. ...................... 29/843; 29/830; 29/840; 174/52.4; 174/260; 427/97
[58] Field of Search .................. 174/52.4, 260; 29/840, 832; 427/97; 264/272.11; 437/219

[56] References Cited

U.S. PATENT DOCUMENTS

| | | | |
|---|---|---|---|
| 3,868,724 | 2/1975 | Perrino | 174/52.4 X |
| 4,604,644 | 8/1986 | Beckham et al. | 29/840 X |
| 4,812,420 | 3/1989 | Matsuda et al. | 264/272.11 X |
| 5,192,835 | 3/1993 | Bull et al. | 174/260 |
| 5,232,532 | 8/1993 | Hori | 29/832 X |
| 5,235,741 | 8/1993 | Mase | 156/275.7 X |
| 5,255,430 | 10/1993 | Tallaksen | 174/52.4 X |
| 5,271,548 | 12/1993 | Maiwald . | |
| 5,317,801 | 6/1994 | Tanaka et al. | 427/97 X |
| 5,361,491 | 11/1994 | Domachi et al. | 427/97 X |
| 5,386,624 | 2/1995 | George et al. | 29/832 |
| 5,435,732 | 7/1995 | Angulas et al. | 29/840 X |

FOREIGN PATENT DOCUMENTS 4537847  12/1970  Japan ...................... 29/846

OTHER PUBLICATIONS

IBM Technical Disclosure Bulletin vol. 32 No. 10B Mar. 1990 p. 480.

*Primary Examiner*—Carl J. Arbes
*Attorney, Agent, or Firm*—Kenyon & Kenyon

[57] ABSTRACT

A method for electroconductively connecting two electronic circuits to one another. A contact is coated with a liquefied, electrically conductive, flux-free solder, and the coated contact is arranged over the other contact. Then, in the molten state, the electrically conductive solder is electroconductively connected to the other contact and hardened. In addition, a liquefied, hardenable, non-conducting bonding means is introduced between the two electronic circuits.

16 Claims, 1 Drawing Sheet

's5,537,739

METHOD FOR ELECTOCONDUCTIVELY CONNECTING CONTACTS

FIELD OF THE INVENTION

The present invention relates to a method for electroconductively connecting at least one contact of an electronic circuit to at least one other contact of another electronic circuit.

BACKGROUND INFORMATION

It is generally known to electroconductively interconnect contacts by wetting one of the contacts with solder containing added soldering flux. This can have the disadvantage that the soldering flux causes corrosion which diminishes the mechanical load-bearing capacity of the soldered connection. Moreover, the soldering flux prevents an adhesive agent from sticking to the surface of the circuit, so that the mechanical load-bearing capacity of the soldered joint breaks down slightly, since no adhesive agent can be provided to increase the load-bearing capacity.

SUMMARY OF THE INVENTION

The method according to the present invention has the advantage that the function of electrically connecting, as well as of mechanically connecting, two contacts is carried out by separate connecting means, so that the danger of the electrical connection reducing the quality of the mechanical connection is lessened. Furthermore, the advantage unfolds that both the electrical connection as well as the mechanical connection can be achieved by means of special connecting means, which first develop into thermally stable connecting means as a result of the connecting (bonding) process, so that the connection of the two circuits also endures in the case of thermal stress.

By applying an adhesive agent that is able to flow due to capillary action, the automatically occurring flow process produces the advantage that the adhesive is uniformly distributed into the space between the two electronic circuits, through which means the bonding strength between the two circuits is increased.

Another advantage is provided because at least one of the first three process steps is carried out in an inert gas atmosphere, since this makes it possible to prevent oxidation of the contact surfaces, so that the quality of the electrical connection is improved.

The liquefication of the flux-free electroconductive solder by means of heat or friction represents an especially low-cost realization of the third process step.

Covering the contact with a nickel coating produces the advantage of a metallurgically more stable soldered joint.

By covering the contact or the other contact with a gold coating, one attains the advantage that a nearly bare, oxide-free metal surface is made available for the soldering operation. This facilitates the wetting operation using flux-free, electroconductive solder.

Sn63Pb, which is applied to the contact by means of wave soldering, represents an especially advantageous solder selection, because the properties of this material with respect to melting point, conductivity, and thermal stability, as well as migration resistance, are very suitable for the electrical contact. In the wave soldering operation, the contact is wetted with a predetermined, very small quantity of the bonding means, so that after the actual conductive connection is manufactured, substantially more thermally stable connections are formed through diffusion.

The use of a transport frame facilitates the handling of the electronic circuit in the first process step.

It proves furthermore to be advantageous to secure a plurality of electronic circuits together on one transport frame, since this reduces the expenditure entailed for several circuits.

DETAILED DESCRIPTION

Figure 1:
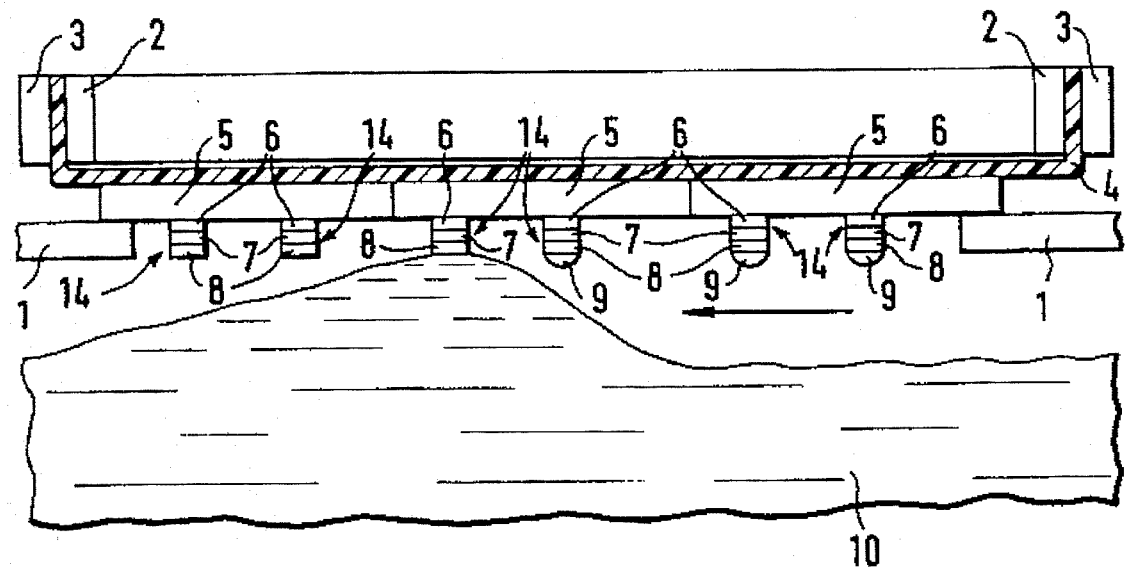
FIG. 1 illustrates the method of coating the contacts of an electronic circuit by means of wave soldering, according to the present invention.

FIG. 1 illustrates a method for coating contacts of an electronic circuit, according to the present invention. A hollow-cylindrical inner frame 2 is covered with a carrier sheet (foil) 4 and fitted in a hollow-cylindrical outer frame 3. A plurality of electronic circuits 5 are secured to the carrier sheet 4. Each electronic circuit 5 has two contacts 14, each having three layers. A bottom-most first metal layer 6 is covered by a middle second metal layer 7, which is covered, in turn, by an upper third metal layer 8.

The arrangement including the inner frame 2, the outer frame 3, the carrier sheet 4, and the electronic circuits 5 is mounted head first on a transport frame 1, which has a cutout through which the contacts 14 of the electronic circuits 5 project downward. A molten solder 10 in the form of tin solder is situated underneath the transport frame 1. Wave excitation of the solder 10 causes a solder wave to travel along the bottom side of the transport frame 1 and, in so doing, to contact the surfaces of the upper metal layer 8 of the contacts 14. The solder 10 leaves behind tin drops 9, which cover the third metal layer 8 of each contact 14 in the form of a flat mound. After this coating process, the transport frame 1 is removed from the solder bath. The electronic circuits 5 are then placed on other electronic circuits 12. The other electronic circuits 12 have other contacts 11, and are preferably secured to a stable carrier element.

Figure 2:
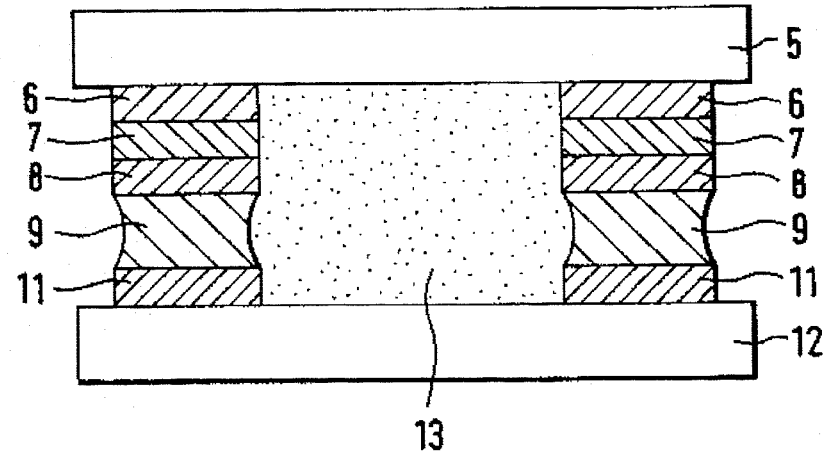
FIG. 2 shows two superposed, interconnected electronic circuits, according to the present invention.

FIG. 2 depicts a bonding site between two electronic circuits 5, 12, the numbering of FIG. 1 having been retained. After the electronic circuit 5 is placed over the other electronic circuit 12 so as to allow the contacts 14 to be situated above the other contacts 11 of the other electronic circuit 12, the contacts 14 having the tin drops 9 are pressed against the other contacts 11 by applying light shaking movements and an elevated temperature, through which means an electroconductive connection is produced between the contacts 14 and the other contacts 11, in that, in the molten state, the solder bonds to the surface of the other contacts 11. In addition, an adhesive agent 13 is filled in between the contacts 14 and, due to the capillary action of the smallest gap between the electronic circuits 5, 12, flows into their interstitial space. The flow properties and the adhesion of the adhesive agent 13 to the circuits 5, 12 are, above all, not diminished by a fluxing agent.

Aluminum is preferably used as a first metal layer 6; nickel preferably as a second metal layer 7; and gold preferably as a third metal layer 8. The other contact 11 is likewise formed preferably of gold. The special selection of the metals, as well as the small quantity of solder 10 still adhering to the contacts 14 during the wave soldering, results in the formation of an exceedingly thermally stable electrical connection, since relatively little material of the third metal layer 8 and of the other contact 11 diffuses into the solder 10. When, for example, Sn63Pb is used as solder 10, and the contacts 14 are constructed from aluminum, nickel and gold, temperature-stable NiSn, AuPb and AuSn phases are produced.

In a further embodiment of the method according to the present invention, each of the first three process steps (wetting, surface mounting, bonding) can take place under an inert gas atmosphere, for which every reductive gas (such as nitrogen) is suited.

In this manner, the oxide constituent of the metal surface is reduced, which effects a qualitative improvement in the electrical connection between the other contact 11 and the contact 14. The method according to the present invention is especially suited for the manufacturing of flip-chip connections.

What is claimed is:

1. A method for electrically coupling a first contact of a first electronic circuit to a second contact of a second electronic circuit, comprising the steps of:

coating the first contact with a liquefied, electrically conductive solder;

aligning the first contact with the second contact;

electrically connecting, in a molten state, the solder coated on the first contact to the second contact;

allowing the solder to harden; and introducing a non-conducting bond between the first and second electronic circuits.

2. The method according to claim 1, wherein the solder is a flux-free solder.

3. The method according to claim 1, wherein the aligning step includes the step of positioning the first electronic circuit over the second electronic circuit.

4. The method according to claim 1, wherein the aligning step includes the step of surface-mounting the first electronic circuit on the second electronic circuit.

5. The method according to claim 1, wherein the bond includes a liquefied, hardenable bonding agent.

6. The method according to claim 1, wherein the bond includes an adhesive agent capable of flowing due to capillary action.

7. The method according to claim 1, wherein at least one of the coating, aligning, and connecting steps is performed in an inert gas atmosphere.

8. The method according to claim 1, further comprising the step of liquefying the solder by using at least one of heat and friction.

9. The method according to claim 1, further comprising the step of covering the first contact with a nickel coating, prior to the coating step.

10. The method according to claim 9, further comprising the step of covering the nickel coating with a gold coating.

11. The method according to claim 1, further comprising the step of covering at least one of the first and second contacts with a gold coating, prior to the coating step.

12. The method according to claim 1, wherein the solder includes a metal.

13. The method according to claim 12, wherein the metal includes Sn63Pb.

14. The method according to claim 1, wherein the solder is coated on the first contact by using wave soldering.

15. The method according to claim 1, further comprising the step of securing the first electronic circuit to a transport frame, prior to the coating step.

16. The method according to claim 1, further comprising the step of securing a plurality of first electronic circuits to a shared transport frame.

* * * * *